(12) United States Patent
Raghu

(10) Patent No.: US 8,273,261 B2
(45) Date of Patent: Sep. 25, 2012

(54) METHODS OF FORMING SEMICONDUCTOR CONSTRUCTIONS

(75) Inventor: Prashant Raghu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 317 days.

(21) Appl. No.: 12/750,457

(22) Filed: Mar. 30, 2010

(65) Prior Publication Data

US 2010/0190344 A1    Jul. 29, 2010

Related U.S. Application Data

(63) Continuation-in-part of application No. 11/218,229, filed on Aug. 31, 2005, now Pat. No. 7,713,813.

(51) Int. Cl.
*C03C 15/00* (2006.01)

(52) U.S. Cl. ............ 216/83; 216/37; 438/243; 438/253; 438/396; 257/306; 257/308

(58) Field of Classification Search .................. 216/37, 216/83; 438/243, 253, 396; 257/306, 308
See application file for complete search history.

(56) References Cited

U.S. PATENT DOCUMENTS

| | | | |
|---|---|---|---|
| 5,811,848 A | 9/1998 | Chao | |
| 5,972,123 A * | 10/1999 | Verhaverbeke | 134/3 |
| 6,187,623 B1 | 2/2001 | Hirota et al. | |
| 6,455,424 B1 | 9/2002 | McTeer et al. | |
| 2002/0151133 A1* | 10/2002 | Chen et al. | 438/244 |
| 2003/0034514 A1 | 2/2003 | Chen et al. | |
| 2005/0054159 A1 | 3/2005 | Manning et al. | |
| 2005/0167724 A1* | 8/2005 | Choi et al. | 257/308 |
| 2006/0014344 A1* | 1/2006 | Manning | 438/243 |
| 2006/0046382 A1 | 3/2006 | Yoon et al. | |

OTHER PUBLICATIONS

Kim, D. et al., "A Mechanically Enhanced Storage Node for Virtually Unlimited Height (MESH) Capacitor Aiming at Sub 70nm DRAMs", IEEE IEDM 2004, pp. 69-72.

* cited by examiner

*Primary Examiner* — Nadine G Norton
*Assistant Examiner* — Maki Angadi
(74) *Attorney, Agent, or Firm* — Wells St. John P.S.

(57) ABSTRACT

The invention includes methods in which silicon is removed from titanium-containing container structures with an etching composition having a phosphorus-and-oxygen-containing compound therein. The etching composition can, for example, include one or both of ammonium hydroxide and tetra-methyl ammonium hydroxide. The invention also includes methods in which titanium-containing whiskers are removed from between titanium-containing capacitor electrodes. Such removal can be, for example, accomplished with an etch utilizing one or more of hydrofluoric acid, ammonium fluoride, nitric acid and hydrogen peroxide.

12 Claims, 17 Drawing Sheets

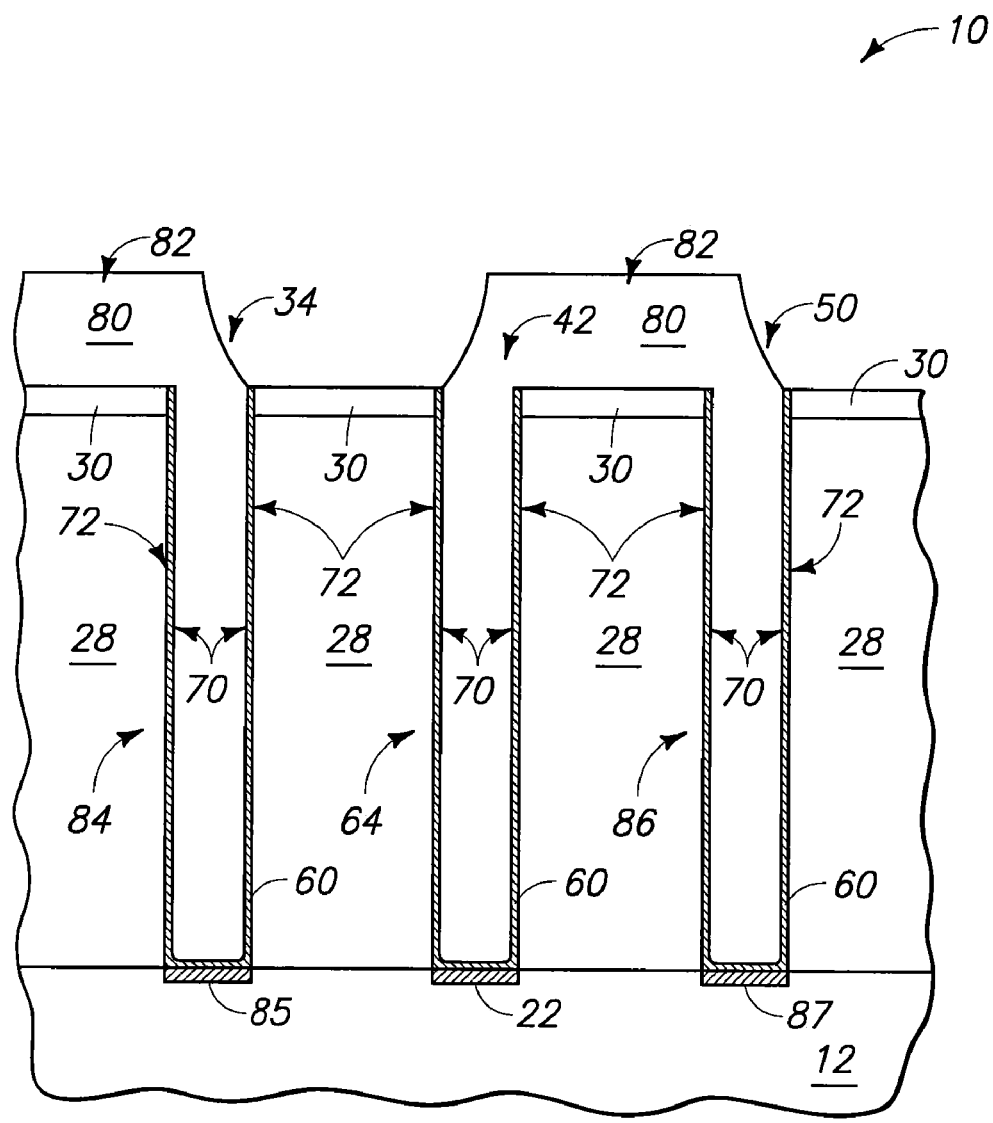
F I G 9

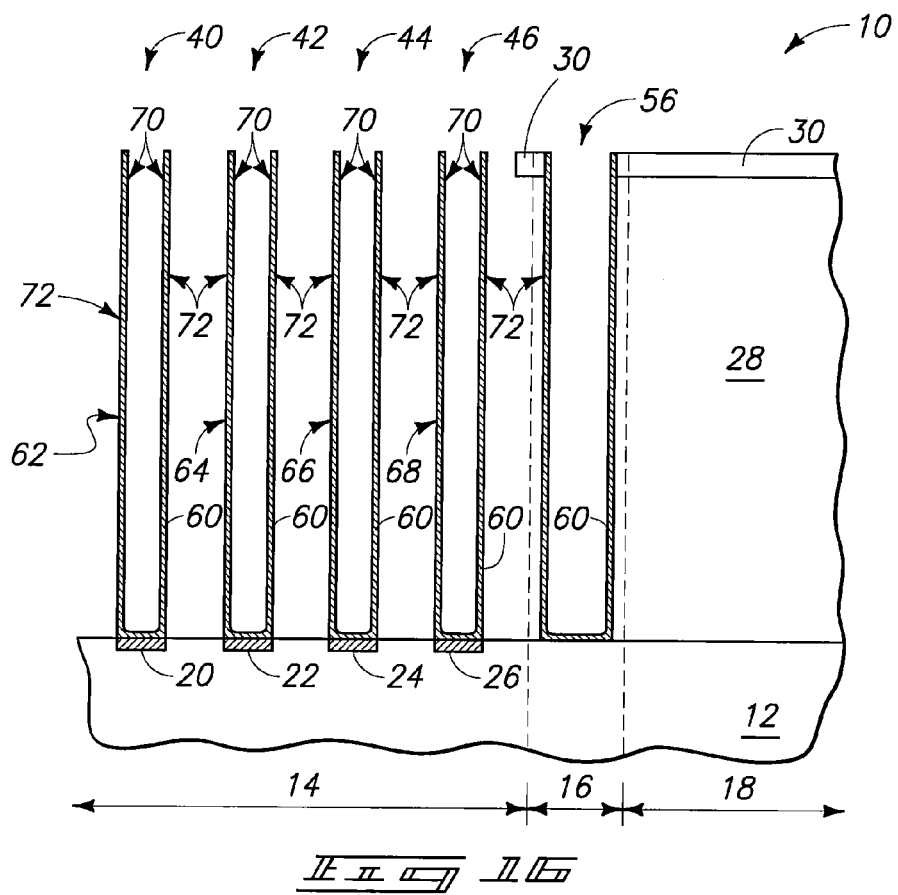
_FIG. 16_
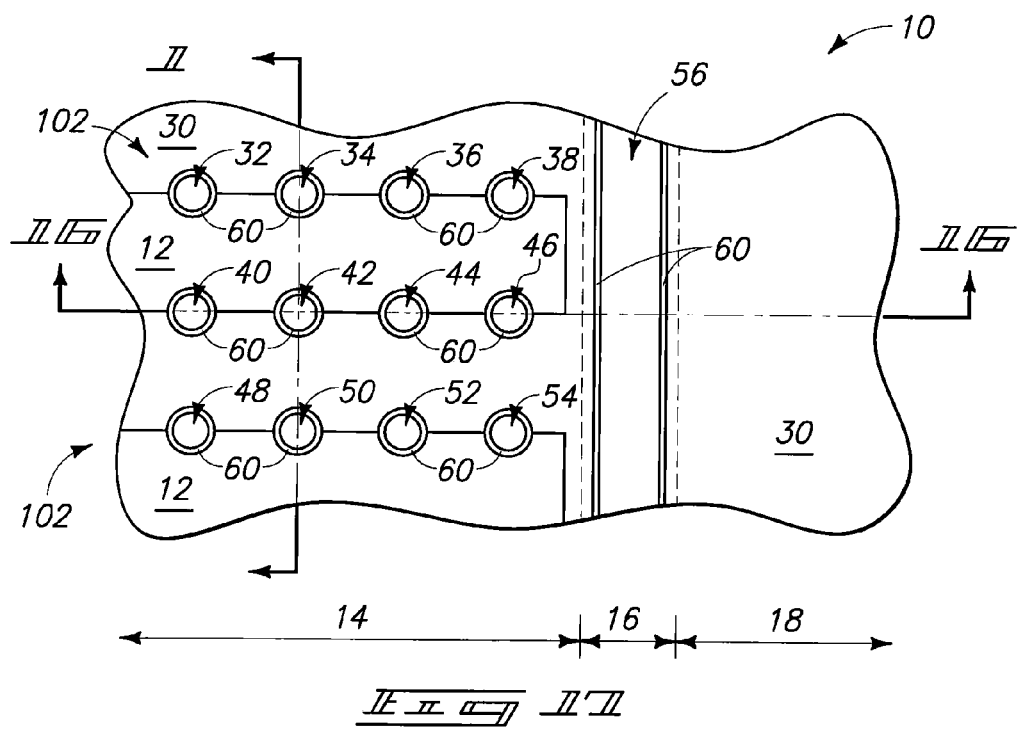
_FIG. 17_

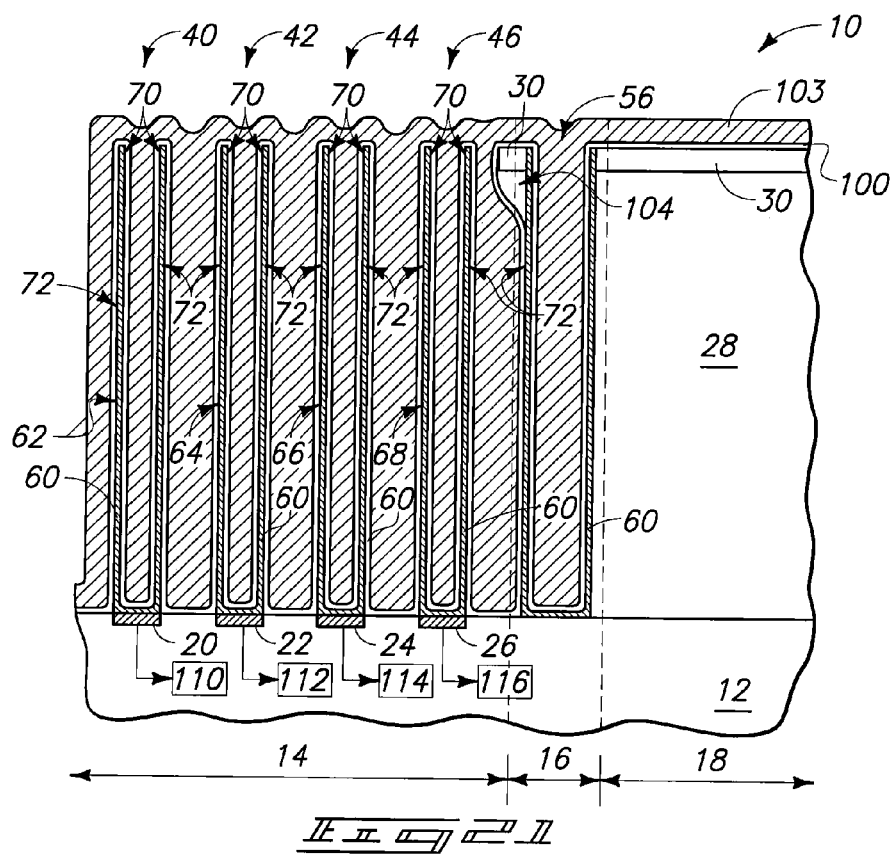
_FIG. 21_
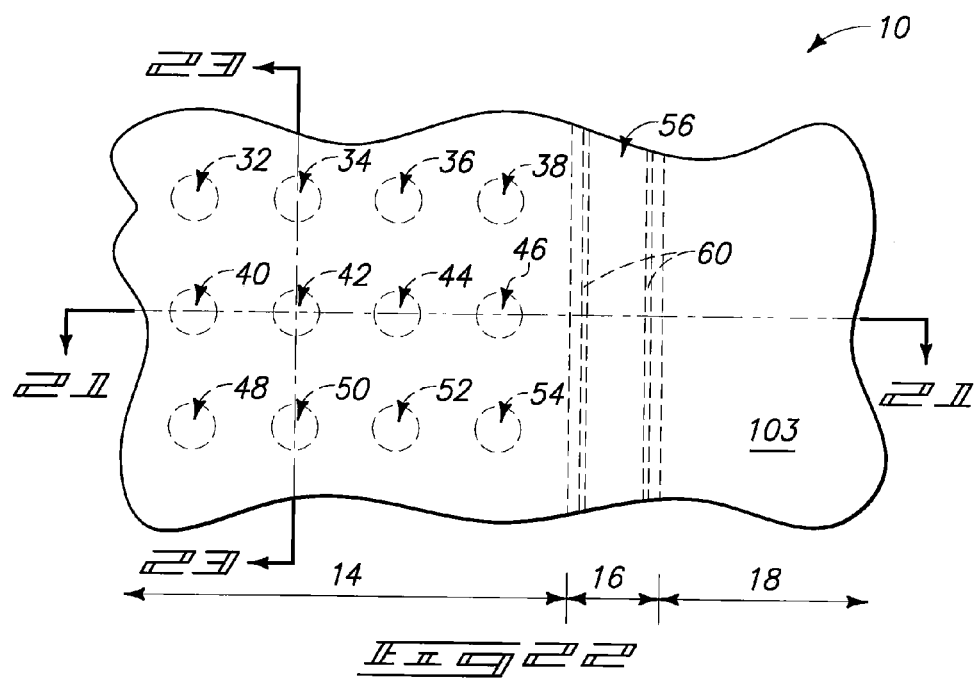
_FIG. 22_

METHODS OF FORMING SEMICONDUCTOR CONSTRUCTIONS

RELATED PATENT DATA

This patent resulted from a divisional of U.S. patent application Ser. No. 11/218,229, which was filed Aug. 31, 2005, and which is hereby incorporated herein by reference.

TECHNICAL FIELD

The invention pertains to methods of forming semiconductor constructions, and in particular aspects pertains to methods of forming capacitors associated with semiconductor constructions.

BACKGROUND OF THE INVENTION

Capacitors continue to have increasing aspect ratios in higher generation integrated circuitry fabrication. For example, dynamic random access memory (DRAM) capacitors now have elevations of from 2 to 3 microns, and widths of about 0.1 micron. Further, it is a continuing goal to increase the density of semiconductor devices, with a corresponding goal to reduce the footprint associated with individual devices. As the packing density of capacitors becomes increasingly greater, the available surface area for capacitance decreases.

A common type of capacitor is a so-called container device, which is typically in cylindrical form. One of the electrodes of such device is shaped as a container, and subsequently dielectric material and another capacitor electrode are formed within the container. Typically, only the interior surfaces of the containers are being utilized for capacitance surface area. It would be desirable to utilize exterior surfaces of the containers for capacitance as well. Unfortunately, exposure of both the interior and exterior surfaces of a container having a high aspect ratio can render the container structurally weak, and subject to toppling or breaking from an underlying base. It would therefore be desirable to develop methods which enable exterior surfaces of high aspect ratio containers to be utilized as capacitive surfaces while avoiding toppling or other loss of structural integrity of the high aspect ratio containers.

Exemplary methodology being developed to avoiding toppling of high aspect ratio containers is so-called lattice methodology. In such methodology, a lattice is provided to hold container-shaped electrodes from toppling, while leaving outer surfaces of the container-shaped electrodes exposed for utilization as capacitive surfaces of capacitors. During lattice methodology, container-shaped electrodes are formed in openings in a supporting material (such as, for example, borophosphosilicate glass (BPSG)), and then the supporting material is removed with an isotropic etch.

The supporting material is commonly over a memory array region and over a peripheral region adjacent the memory array region, and is only to be removed from the memory array region during the etch. A moat will typically be provided between the memory array region and the peripheral region, and one or more protective layers will be within the moat and over the peripheral region to protect the supporting material of the peripheral region during the isotropic etching of such material from the memory array region. As will be discussed in more detail later in this disclosure, it can be desired to provide sacrificial silicon-containing material within the container-shaped electrodes, and within the moat between the memory array region and the peripheral region, to protect various materials during the isotropic etch of the supporting material. Difficulties can occur during removal of the sacrificial silicon-containing material, and in some aspects the invention described herein addresses such difficulties.

SUMMARY OF THE INVENTION in one aspect, the invention includes a method of forming a semiconductor construction. Upwardly-opening titanium-containing container structures are formed within a first material and over a semiconductor substrate. Silicon is formed within the upwardly-opening container structures. After the silicon is formed, at least some of the first material is removed to exposed outer services of the upwardly-opening container structures. The silicon is then removed with an etching solution having a phosphorus-and-oxygen-containing compound therein.

In one aspect, the invention includes a method of forming a plurality of capacitors. A first material is formed over a semiconductor substrate, and openings are formed to extend into the first material. Titanium-containing material is formed within the openings to narrow the openings. Silicon is formed within the narrowed openings. The silicon is removed with an etch utilizing an etching solution containing at least one nitrogen-containing etchant and at least one phosphorus-and-oxygen-containing compound. The titanium-containing material is then incorporated into a plurality of capacitors.

In one aspect, the invention includes another method of forming a plurality of capacitors. An assembly is provided which comprises a semiconductor substrate supporting a plurality of electrical nodes, a first material over the semiconductor substrate, and an electrically insulative retaining material over the first material. Openings are formed to extend through the retaining material and the first material to the electrical nodes. Capacitor electrode material is formed in the openings to narrow the openings, and silicon is formed within the narrowed openings. While the silicon is within the narrowed openings, at least some of the first material is etched with an isotropic etch selective for the first material relative to the retaining material. The silicon is then removed with a silicon etch. The silicon etch forms whiskers of the capacitor electrode material. The whiskers are removed with an etch, and then the conductive capacitor electrode material remaining within the openings is incorporated into a plurality of capacitors.

In one aspect, the invention includes yet another method of forming a plurality of capacitors. A construction is provided which comprises a memory array region, a region other than the memory array region, and a location between the memory array region and said other region. A first material is formed to extend over the memory region, over said other region, and over the location between the memory array region and said other region. A second material is formed over at least a portion of the first material that is over the memory array region and over an entirety of the first material that is over said other region. Openings are formed to extend into the first material over the memory region and a trench is formed within the first material over the location between the memory region and said other region. A first conductive material is formed in the openings and within the trench. The first conductive material within the openings forms container structures having outer sidewalls along the first material. Silicon is formed within the trench and within the openings. After the silicon is formed, at least some of the first material is removed to expose at least portions of the outer sidewalls of the container structures. The silicon is removed with an etching composition having at least one phosphorus-and-oxygen-containing compound dispersed therein. A capacitor dielectric material is formed along the exposed portions of the outer sidewalls and within the container structures. A second conductive material is formed over the capacitor dielectric material.

BRIEF DESCRIPTION OF THE DRAWINGS

Preferred embodiments of the invention are described below with reference to the following accompanying drawings.

FIG. 9 is a diagrammatic, cross-sectional view along the line 9-9 of the FIG. 8 fragment, and illustrates a slightly different aspect of the invention than FIGS. 7 and 8.

FIG. 16 is a view of the FIG. 1 cross-section shown at a processing stage subsequent to that of FIG. 13.

FIG. 17 is a diagrammatic top view of a semiconductor wafer fragment comprising the cross-section of FIG. 16 along the line 16-16.

FIG. 21 is a view of the FIG. 1 cross-section shown at a processing stage subsequent to that of FIG. 16.

FIG. 22 is a diagrammatic top view of a semiconductor wafer fragment comprising the cross-section of FIG. 21 along the line 21-21.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methodology for forming container capacitors. In typical processing, a semiconductor wafer will have a memory array region where capacitors are to be formed. It can be desired to etch sacrificial silicon-containing material from the memory array region, while avoiding formation of conductive whiskers from storage node material exposed to the etch. Methodology of the present invention can include dispersal of phosphoric acid in the etching solution utilized to remove the silicon to alleviate the formation of the conductive whiskers. The invention can additionally, or alternatively, include methodology for removing any whiskers that have formed.

Various aspects of the invention are described below with reference to FIGS. 1-25.

Figure 1:
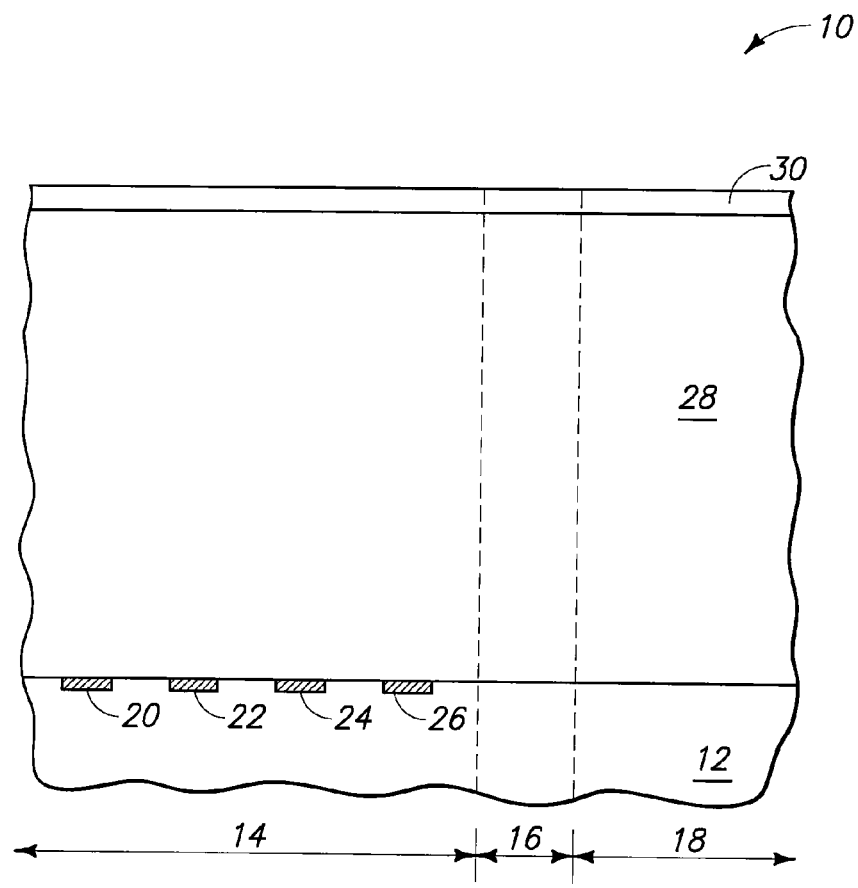
FIG. 1 is a diagrammatic, cross-sectional view of a semiconductor wafer fragment at a preliminary processing stage of an exemplary aspect of the present invention.

Referring to FIG. 1, a semiconductor wafer fragment 10 is shown at a preliminary processing stage of an exemplary aspect of the present invention. Fragment 10 comprises a substrate 12. Substrate 12 can comprise, consist essentially of, or consist of, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 is divided into three defined regions 14, 16 and 18. Region 14 corresponds to a memory array region. Region 18 corresponds to a region other than the memory array region, and can correspond to, for example, a so-called peripheral region. The region is referred to as a peripheral region because it is peripheral to the memory array region. Typically, logic circuitry and other circuitry associated with the control of data flow to and from memory devices associated with memory array region 14 would be associated with peripheral region 18. Region 16 corresponds to a location between the memory array region 14 and the peripheral circuitry associated with region 18. Dashed lines are provided through construction 10 to demarcate the various defined regions 14, 16 and 18 extending within the structure. Various circuit devices (not shown) could be associated with region 18 at the processing stage of FIG. 1.

A plurality of electrically conductive node locations 20, 22, 24 and 26 are shown within memory array region 14 of substrate 12. Node locations 20, 22, 24 and 26 can correspond to, for example, conductively-doped diffusion regions within a semiconductive material of substrate 12, and/or to conductive pedestals associated with substrate 12. Although the node locations are shown to be electrically conductive at the processing stage of FIG. 1, it is to be understood that the electrically conductive materials of the node locations could alternatively be provided at a processing stage subsequent to that of FIG. 1. Node locations 20, 22, 24 and 26 can ultimately be electrically connected with transistor constructions (not shown in FIG. 1) and can correspond to source/drain regions of the transistor constructions, or can be ohmically connected to source/drain regions of the transistor constructions. Transistor gates and other components of the transistor constructions can be present within memory array region 14 at the processing stage of FIG. 1, or can be formed in subsequent processing.

A mass 28 is formed over substrate 12. Mass 28 can comprise a single homogeneous layer (as shown), or can comprise multiple layers of differing composition and/or physical properties. Mass 28 can comprise, consist essentially of, or consist of one or more electrically insulative materials. In particular aspects, mass 28 will comprise, consist essentially of, or consist of one or more of borophosphosilicate glass (BPSG), spin-on-glass (SOG), silicon dioxide, phosphosilicate glass (PSG), borosilicate glass (BSG), undoped glass, and silicon nitride. In some aspects, mass 28 will comprise, consist essentially of, or consist of silicon and oxygen. Mass 28 can have a thickness over substrate 12 of, for example, from about 5,000 Å to about 50,000 Å, and typically will have a thickness of about 20,000 Å.

A retaining structure (also referred to as a lattice structure) 30 is formed over mass 28. Retaining structure 30 can comprise a single homogeneous composition, or can comprise two or more layers of differing composition. In subsequent processing (described below) at least some of mass 28 is selectively etched relative to at least some of retaining material 30. Accordingly, retaining material 30 preferably comprises a composition to which at least some of mass 28 can be selectively etched. In particular aspects, mass 28 can be considered to comprise a first material, and structure 30 can be considered to comprise a second material to which the first material is ultimately selectively etched. In some aspects, retaining structure 30 will comprise, consist essentially of, or consist of silicon and nitrogen. In an exemplary aspect, mass 28 will comprise, consist essentially of, or consist of borophosphosilicate glass and retaining structure 30 will comprise, consist essentially of, or consist of silicon nitride. If retaining structure 30 consists essentially of, or consists of silicon nitride, the structure can have a thickness of from about 50 Å to about 3,000 Å, and typically will have a thickness of about 700 Å.

Figure 2:
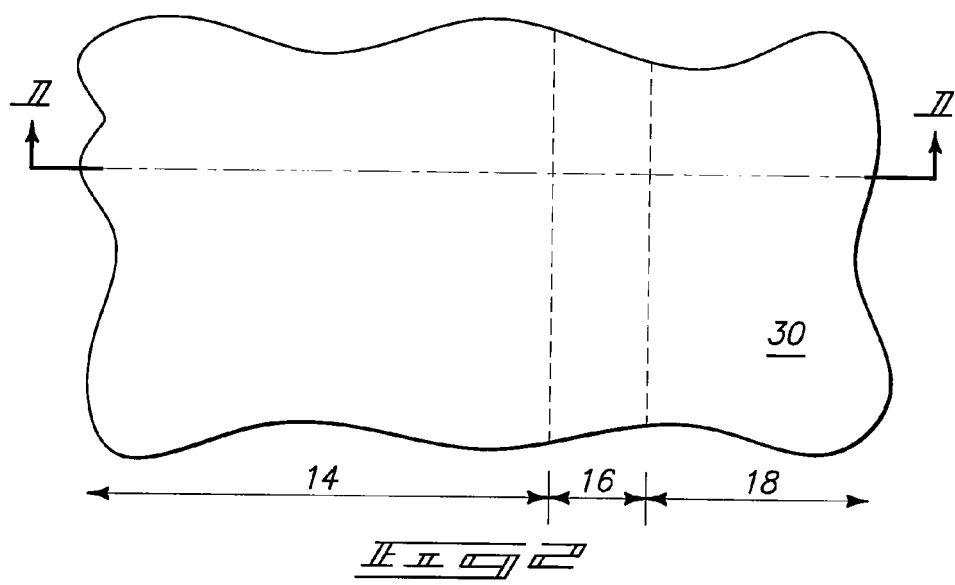
FIG. 2 is a fragmentary top view of a semiconductor wafer fragment comprising the cross-section of FIG. 1 along the line 1-1.

FIG. 2 shows a top view of a semiconductor wafer fragment comprising the FIG. 1 cross-section, and shows retaining structure 30 extending entirely across the upper surface of the semiconductor construction.

Figure 3:
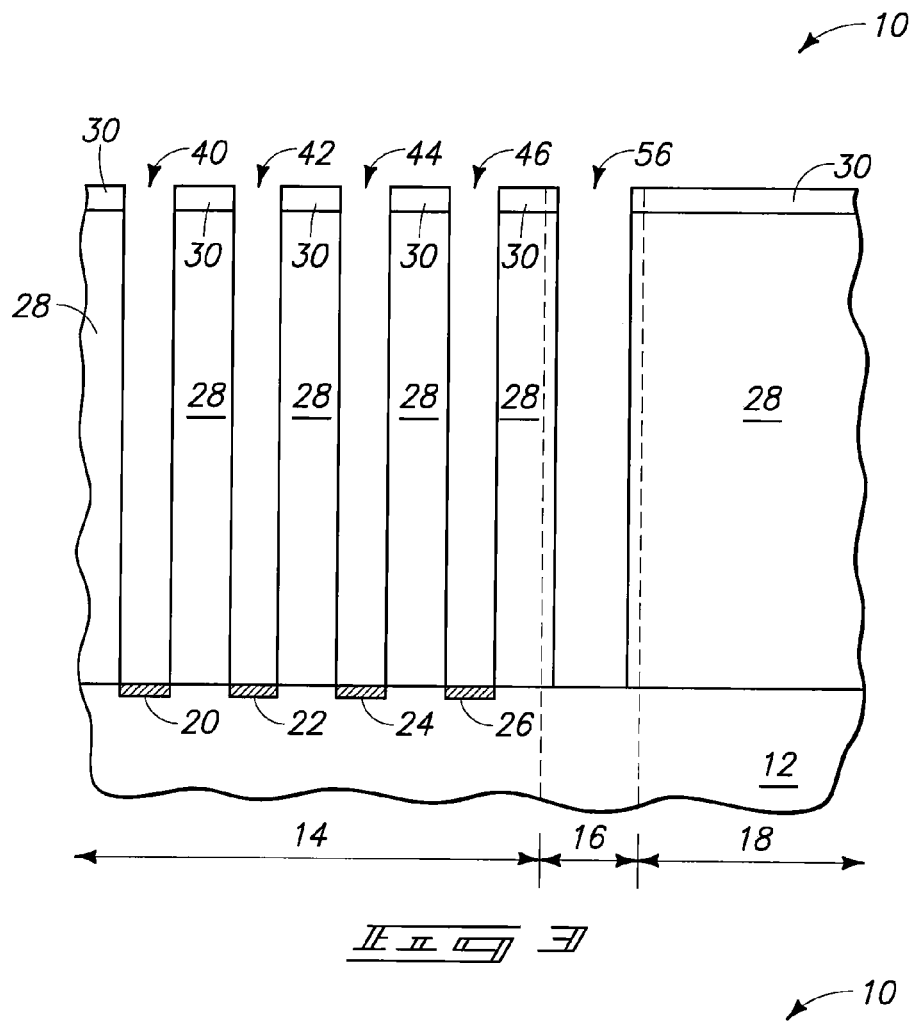
FIG. 3 is a diagrammatic, cross-sectional view of the FIG. 1 wafer fragment shown at a processing step subsequent to that of FIG. 1.
Figure 4:
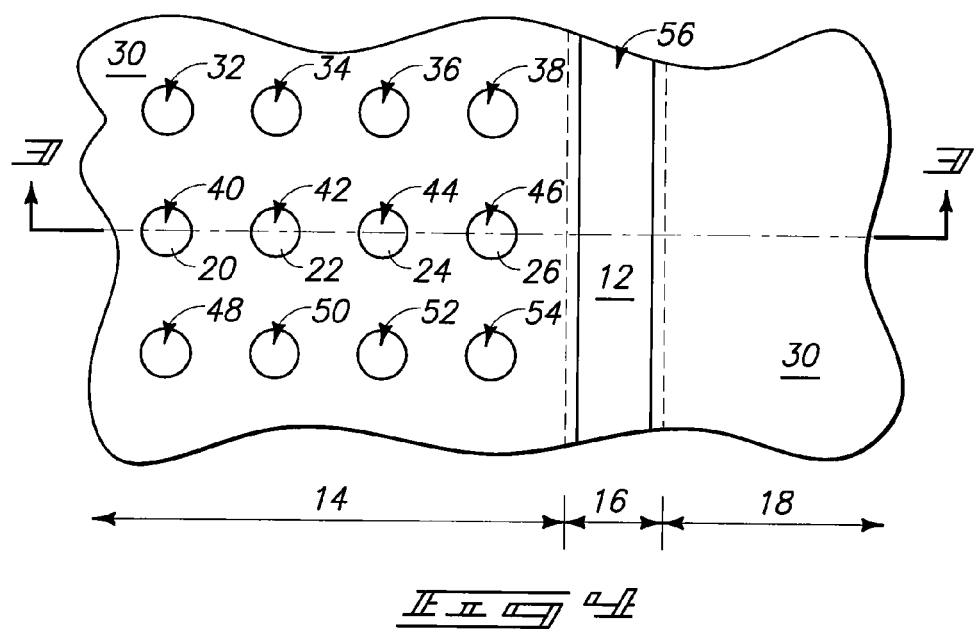
FIG. 4 is a fragmentary top view of a semiconductor construction comprising the fragment of FIG. 3 along the line 3-3.

Referring next to FIGS. 3 and 4, openings 32, 34, 36, 38, 40, 42, 44, 46, 48, 50, 52 and 54 are formed through retaining structure 30 and mass 28, and to the node locations associated with an upper surface of substrate 12, (with the node locations 20, 22, 24 and 26 being shown in FIG. 3). The openings can have a very high aspect ratio, and ultimately are utilized for forming capacitor containers (as discussed below). In particular aspects, the openings can have an elevation of from about 2 to about 3 microns, and a maximum width of about 0.1 micron. The openings are shown to have circular outer peripheries (as illustrated by the top view of FIG. 4), but it is to be understood that the openings can have other shapes. The openings 32, 34, 36, 38, 40, 42, 44, 46, 48, 50, 52, and 54 are ultimately utilized to form containers of capacitors, as discussed in more detail below.

The openings 32, 34, 36, 38, 40, 42, 44, 46, 48, 50, 52, and 54 are formed over memory array region 14 of construction 10, and while the openings are formed a trench (or moat) 56 is formed within location 16 of construction 10.

The formation of the container openings within memory array region 14, and the trench within location 16, would typically be accomplished by first forming a photoresist mask (not shown) with photolithographic processing, and subsequently transferring a pattern from the patterned mask to underlying materials 28 and 30, followed by removal of the patterned photoresist mask. The photolithographic requirements associated with formation of the patterned mask can be relatively stringent, and accordingly an antireflective layer (not shown) can be incorporated into structure 30, formed beneath structure 30, or formed over structure 30 in various aspects of the present invention. The antireflective coating can comprise, for example, either a hard film (for example, dielectric antireflective coating, (DARC)), or a spin-on film (for example, bottom antireflective coating, (BARC)).

Openings 32, 34, 36, 38, 40, 42, 44, 46, 48, 50, 52 and 54 are formed in an array within memory region 14. Such array comprises rows and columns. The rows can be considered to extend horizontally in the view of FIG. 4, and the columns can be considered to extend vertically in the view of FIG. 4.

Although openings 32, 34, 36, 38, 40, 42, 44, 46, 48, 50, 52 and 54 are described as extending through material 28 to underlying conductive nodes (such as nodes 20, 22, 24, and 26) it is to be understood that one or more other layers (not shown) can be provided between the nodes and material 28, and that the openings can stop on the other layers. For instance, an etch stop layer (not shown) can be provided between material 28 and nodes 20, 22, 24, and 26 so that the openings stop on the etch stop layer. The etch stop layer can protect underlying materials (such as the surface of substrate 12 and/or electrical devices (not shown)) supported by the surface during a subsequent isotropic etch of material 28 (discussed below). The openings can be extended through the etch stop and to nodes 20, 22, 24, and 26 with a second etch after the etch through material 28. The etch stop can comprise any suitable material to which material 28 can be selectively etched, and can, for example, comprise, consist essentially of or consist of silicon nitride.

Figure 5:
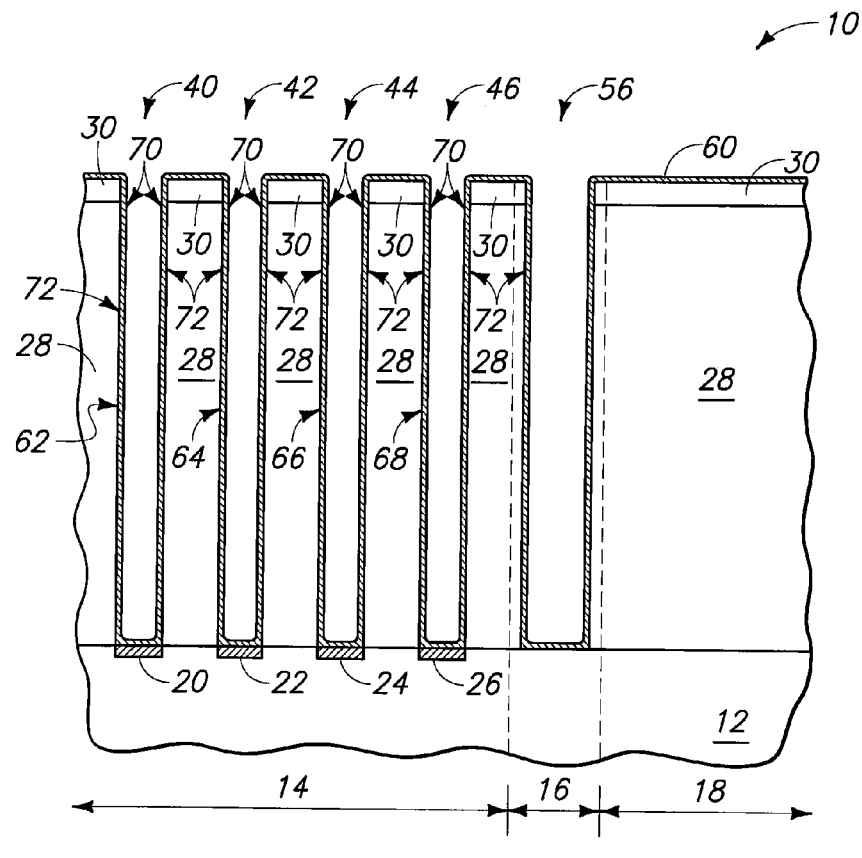
FIG. 5 is a diagrammatic, cross-sectional view of the semiconductor wafer fragment of FIG. 1 at a processing stage subsequent to that of FIG. 3.
Figure 6:
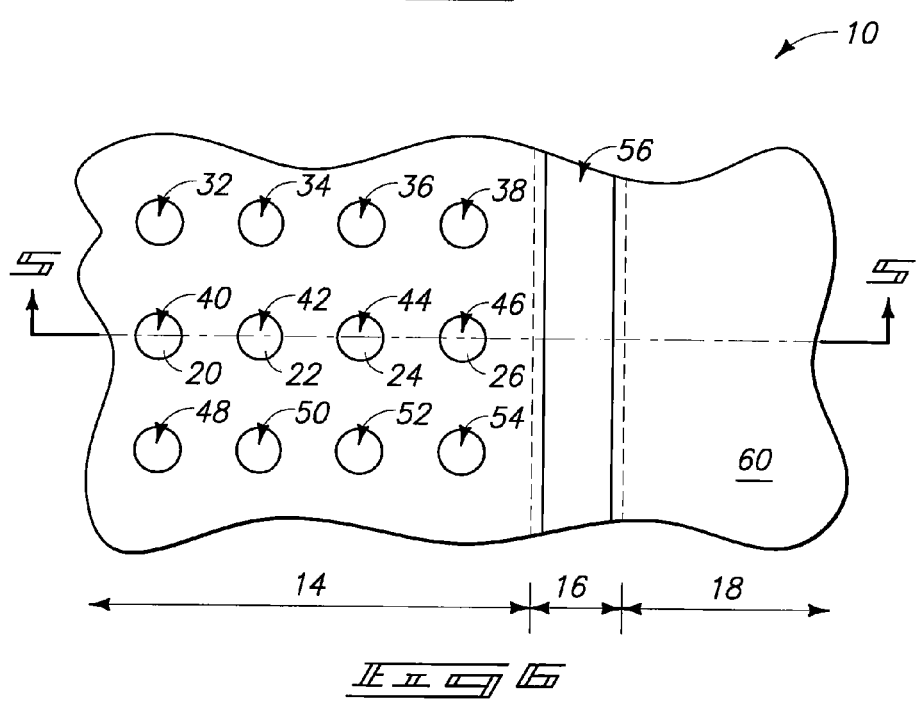
FIG. 6 is a diagrammatic top view of a semiconductor construction comprising the fragment of FIG. 5 along the line 5-5.

Referring next to FIGS. 5 and 6, an electrically conductive material 60 is formed within openings 32, 34, 36, 38, 40, 42, 44, 46, 48, 50, 52 and 54, as well as within trench 56. Conductive material 60 can be a homogeneous composition, or can comprise multiple layers. Accordingly, material 60 can comprise, consist essentially of, or consist of one or more electrically conductive compositions. The electrically conductive compositions within material 60 can be any suitable compositions, including, for example, conductively-doped silicon, metal, and metal compounds. In particular aspects, material 60 be a titanium-containing material, and in such aspects material 60 can, for example, comprise a titanium nitride layer over a titanium layer. The titanium nitride layer can comprise, consist essentially of, or consist of titanium nitride, and the titanium layer can comprise, consist essentially of, or consist of titanium (in elemental form, and/or in a multi-element compound, such as, for example, titanium silicide).

Portions of material 60 within the openings in memory array region 14 can be considered to form upwardly-opening container structures within the openings. For instance, FIG. 5 shows the portions of material 60 within openings 40, 42, 44 and 46 corresponding to container constructions 62, 64, 66 and 68. The container constructions can be considered to comprise inner surfaces 70 within the openings and outer surfaces 72 laterally opposed to the inner surfaces. The outer surfaces 72 extend along mass 28 and retaining structure 30.

Conductive material 60 is ultimately incorporated into capacitor electrodes, and in particular aspects can be incorporated into capacitor storage nodes. Accordingly, material 60 can be referred to as capacitor electrode material, and in particular aspects can be referred to as a storage node material.

Figure 7:
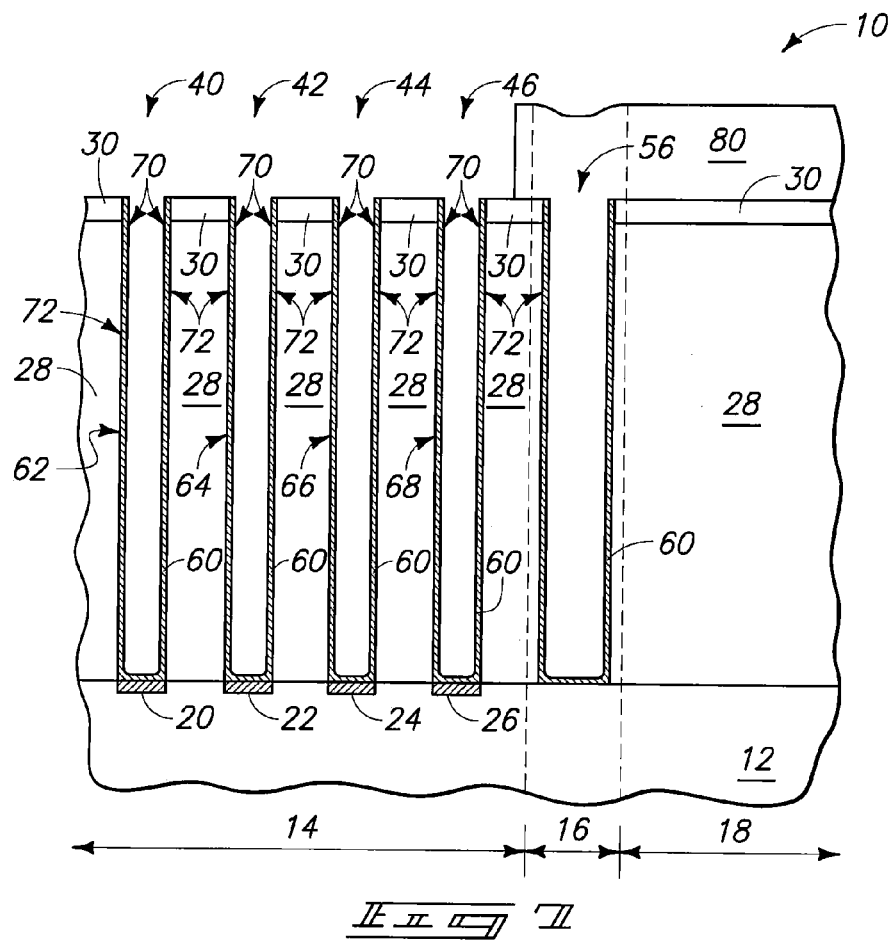
FIG. 7 is a view of the cross-section of FIG. 1 shown at a processing stage subsequent to that of FIG. 5.
Figure 8:
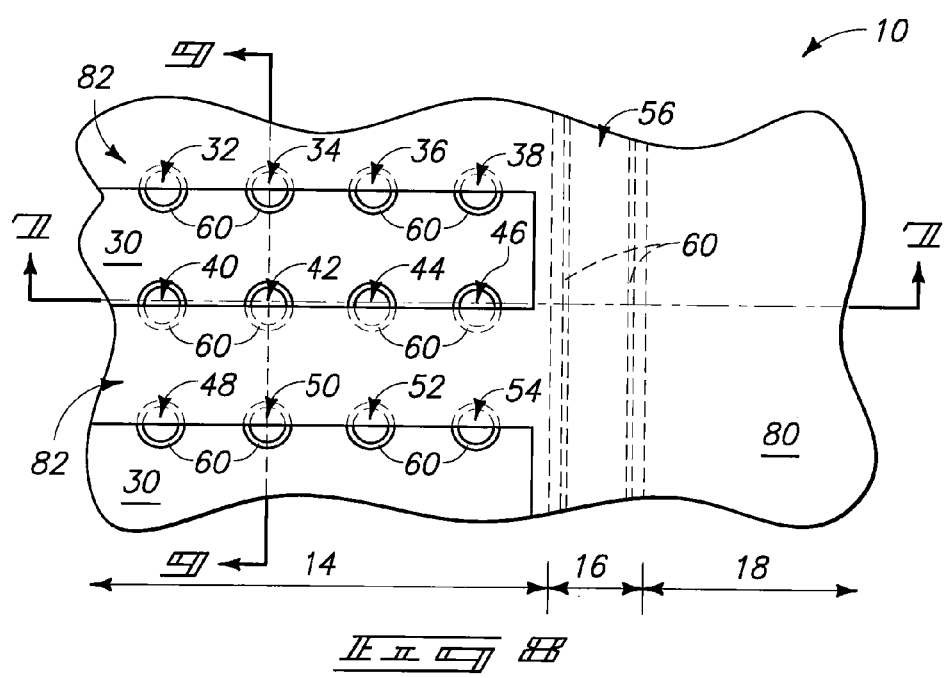
FIG. 8 is a diagrammatic top view of a semiconductor wafer fragment comprising the cross-section of FIG. 7 along the line 7-7.

Referring next to FIGS. 7-9, conductive material 60 is removed from over an upper surface of structure 30 to electrically isolate conductive structures within openings 32, 34, 36, 38, 40, 42, 44, 46, 48, 50, 52 and 54 (such as, for example, the container structures 62, 64, 66 and 68 of FIG. 7) from one another. An exemplary method for removing conductive material 60 from over upper surface 30 is chemical-mechanical polishing.

After removal of material 60 from over the upper surface of structure 30, a patterned mask 80 is formed over memory array region 14, peripheral region 18, and the location 16 between regions 14 and 18. Mask 80 entirely covers regions 16 and 18, but is patterned over region 14 to form rows 82 connecting pairs of capacitor rows. Portions of material 60 in openings 32, 34, 36, 38, 40, 42, 44, 46, 48, 50, 52 and 54 are shown in phantom view in FIG. 8 to indicate that such portions are covered by masking material 80. An exemplary material of mask 80 is photoresist, and such can be formed into the shown pattern utilizing photolithographic processing. The illustrated shape of patterned mask 80 is but one of many possible patterns that can be utilized. The shown shape of patterned mask 80 has strips extending horizontally relative to the view of FIG. 8. In other exemplary shapes (not shown) patterned strips of material 80 can extend to entirely cover particular containers, to extend diagonally relative to the view of FIG. 8 and/or to extend vertically relative to the view of FIG. 8.

The conductive material 60 within trench 56 is shown in phantom view in FIG. 8 to indicate that such material is covered by masking material 80.

FIG. 9 shows containers 84 and 86 associated with openings 34 and 50, in addition to the container 64 associated with opening 42. Containers 84 and 86 extend to node locations 85 and 87, which can comprise similar constructions to those described above relative to node location 22. Container constructions 84 and 86 comprise the interior peripheries 70 and outer peripheries 72 described previously with reference to containers 62, 64, 66 and 68 of FIG. 5. In the shown aspect of the invention, masking material 80 extends into openings 34, 42 and 50. Specifically, the masking material extends along the interior lateral surfaces 70 of each of the openings, and in the shown aspect extends entirely along at least one of the interior lateral surfaces 70 of each of the openings. In typical processing, a sacrificial material (not shown) would be provided in openings 32, 34, 36, 38, 40, 42, 44, 46, 48, 50, 52 and 54 during the above-described chemical-mechanical polishing of material 60. The sacrificial material can be removed from within the openings at any suitable processing stage, which may be a stage before provision of masking material 80, or a stage after provision of masking material 80. If the sacrificial material remains in the openings during provision of masking material 80, the sacrificial material may preclude material 80 from entering the openings. In such aspects, material 80 may not be along the interior surfaces of the openings, but instead would be over the openings. In some aspects it can be desired to leave the sacrificial material within the openings during provision of masking material 80 to alleviate thinning of material 80 that might otherwise occur, and in other aspects it can be desired to remove the sacrificial material prior to formation of masking material 80. The illustration of FIG. 9 is somewhat inconsistent with FIGS. 7 and 8 in that FIG. 9 shows material 80 extending within the opening 42, and FIGS. 7 and 8 show opening 42 having a region within which material 80 does not extend. Thus, FIG. 9 illustrates a slightly different aspect of the invention than FIGS. 7 and 8.

Figure 10:
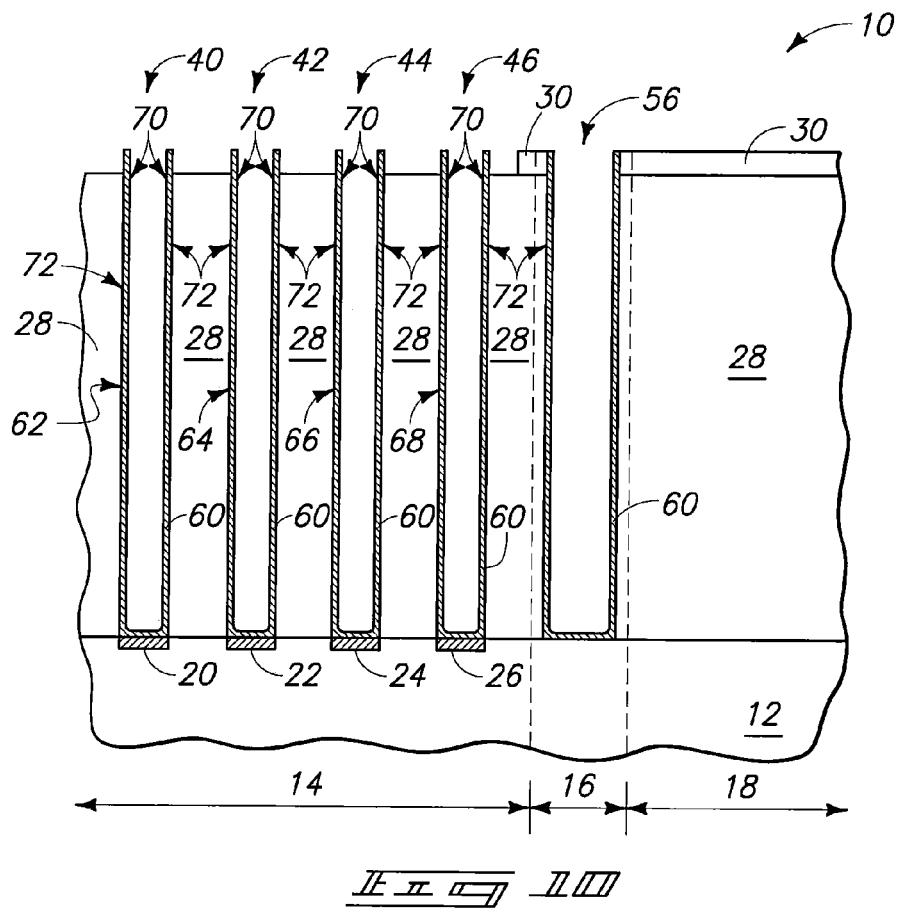
FIG. 10 is a view of the cross-section of FIG. 1 shown at a processing stage subsequent to that of FIG. 7.
Figure 11:
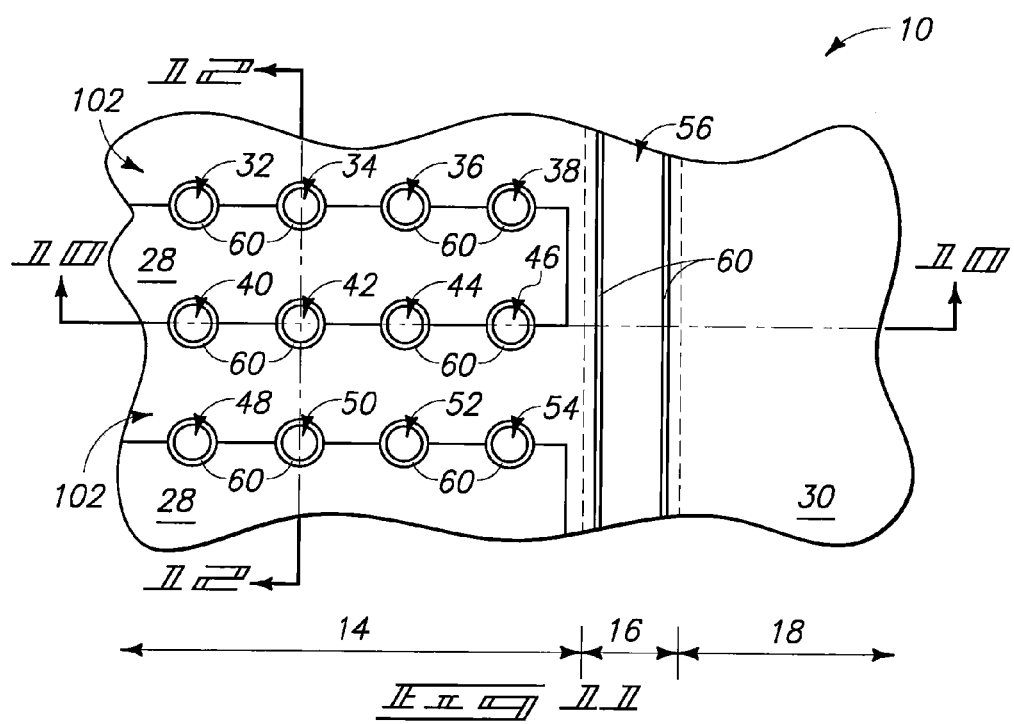
FIG. 11 is a diagrammatic top view of a semiconductor construction comprising the cross-section of FIG. 10 along the line 10-10.
Figure 12:
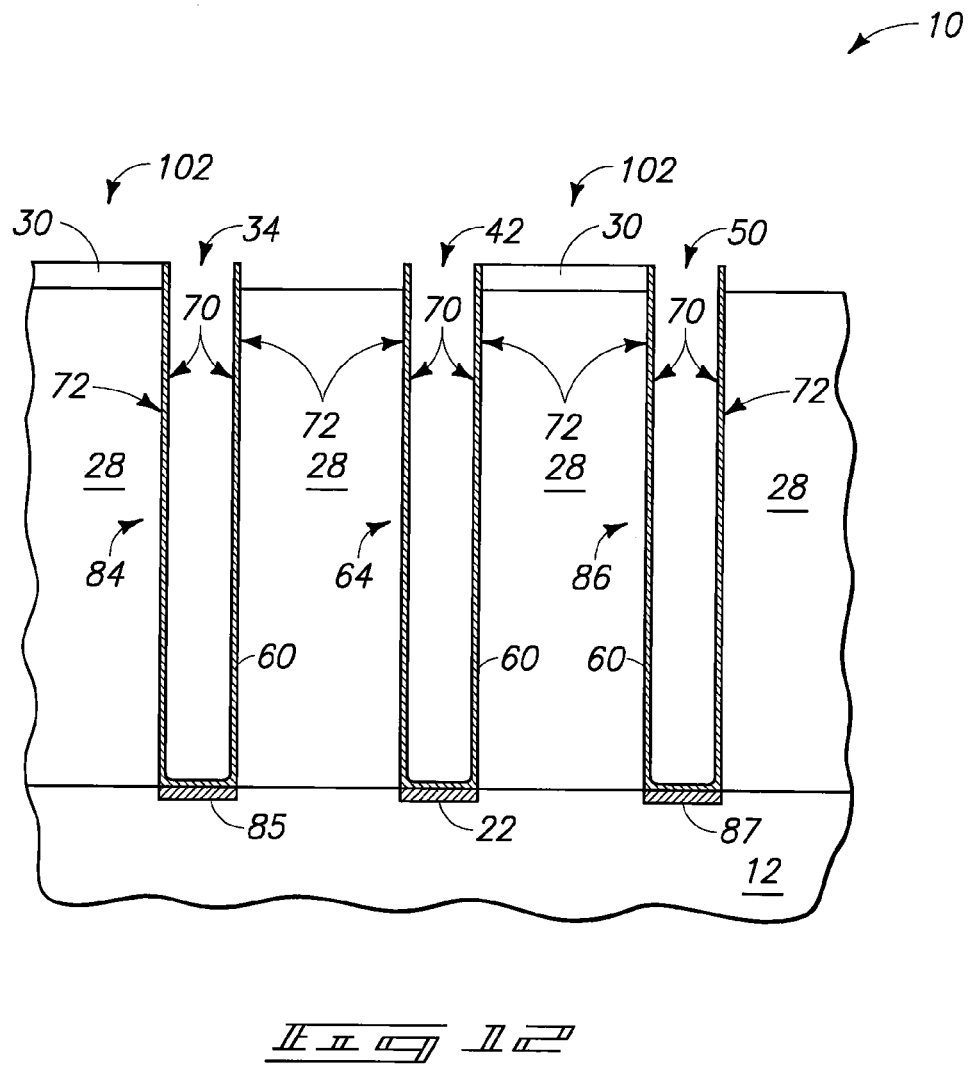
FIG. 12 is a diagrammatic cross-section along the line 12-12 of FIG. 11.

Referring next to FIGS. 10-12, a pattern is transferred from masking material 80 (FIGS. 7-9), to retaining structure 30, and subsequently the masking material is removed.

Removal of structural material 30 exposes portions of the outer surfaces 72 of the containers (for example, containers 62, 64, 66 and 68 of FIG. 10) at uppermost regions of the containers. The material 30 of FIGS. 10-12 has been patterned into a pattern from mask 80 (FIGS. 7-9), and accordingly the material 30 remains continuous over peripheral region 18 and intermediate region 16, and is patterned to comprise rows 102 extending between pairs of capacitor container rows. For instance, the lower row 102 of FIG. 11 connects the horizontal row of capacitor containers containing the containers within openings 40, 42, 44 and 46 with the row of capacitor containers that are within openings 48, 50, 52 and 54. Retaining structure 30 physically contacts the material 60 of the capacitor containers within each row. In particular aspects, the retaining structure 30 can contact all of the container structures associated with an array over memory device region 14, and in other aspects the retaining structure can contact only some of the capacitors. It can be preferred, however, that the retaining structure contact all of the devices in order to alleviate (and preferably prevent) toppling and other structural defects from occurring in the devices in subsequent processing (described below).

Figure 13:
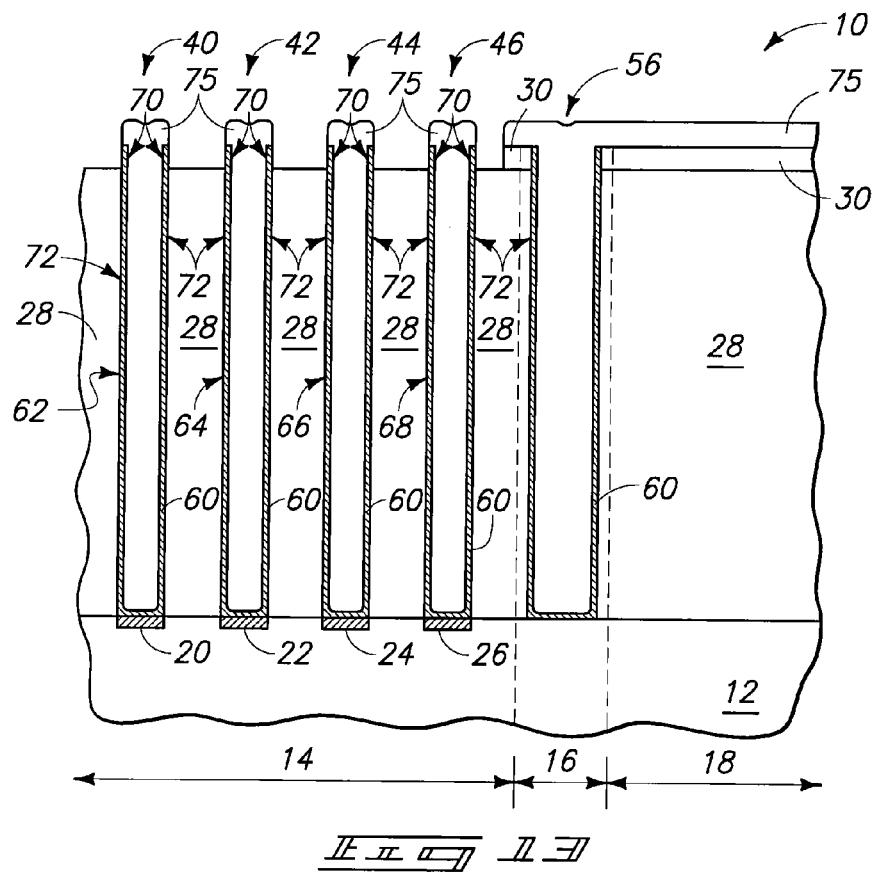
FIG. 13 is a view of the cross-section of FIG. 1 shown at a processing stage subsequent to that of FIG. 10.
Figure 14:
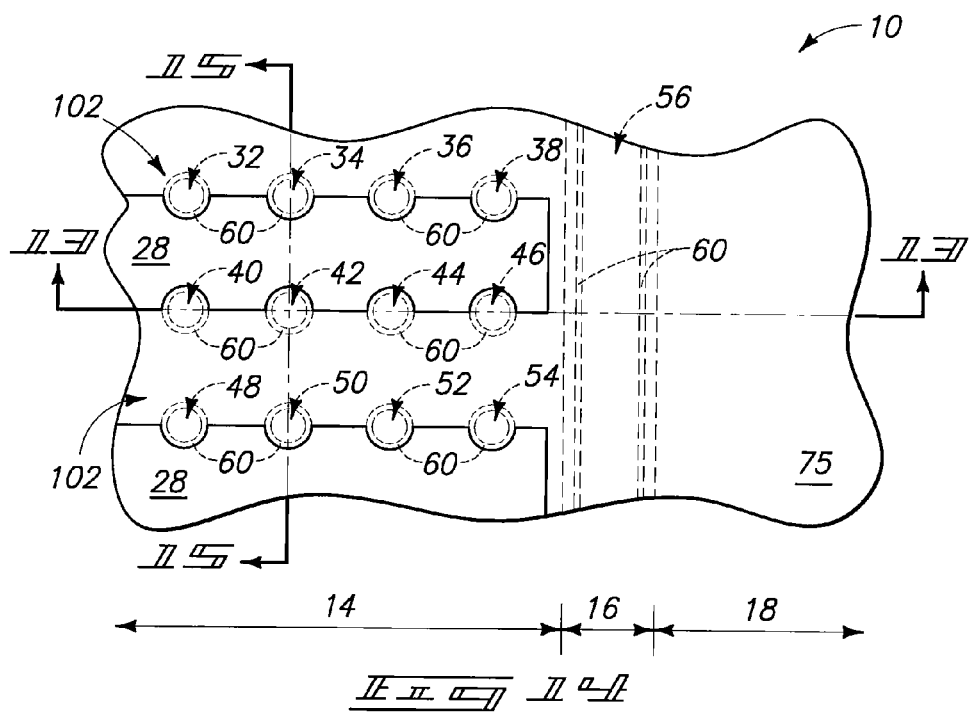
FIG. 14 is a diagrammatic top view of a fragment of a semiconductor construction comprising the cross-section of FIG. 13 along the line 13-13.
Figure 15:
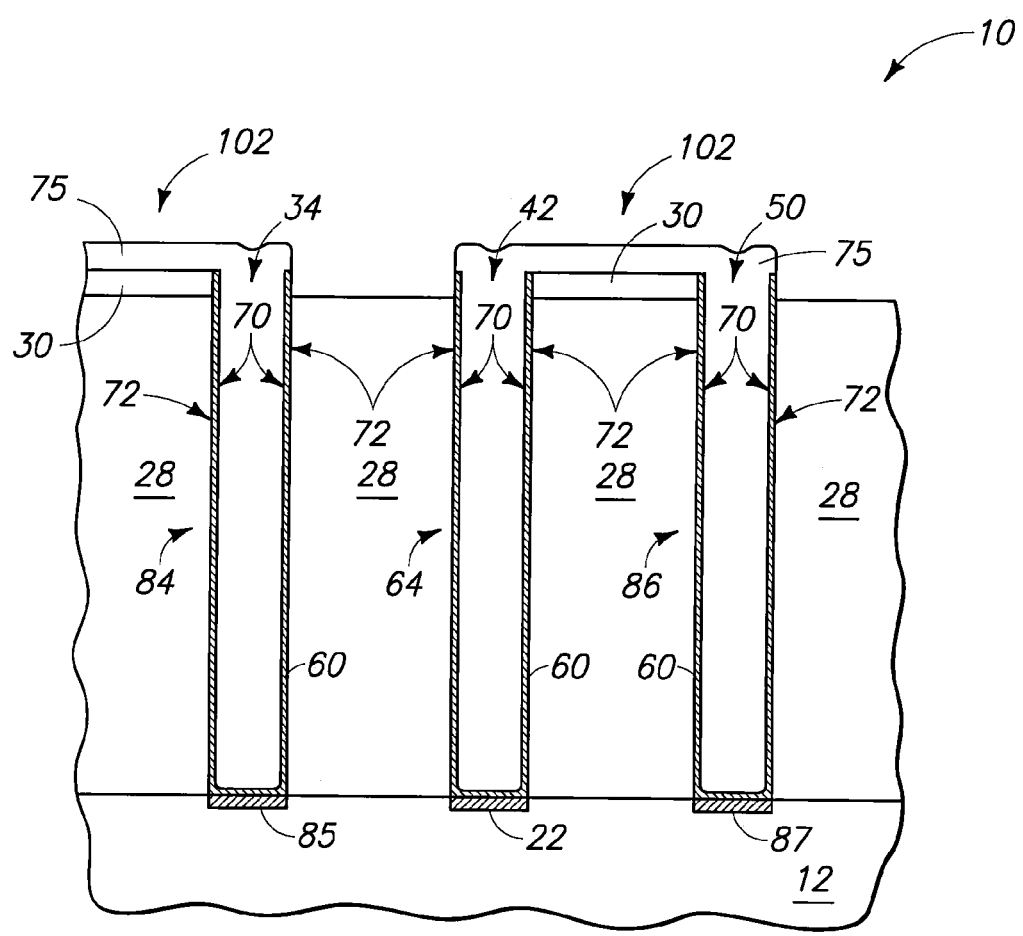
FIG. 15 is a diagrammatic, cross-sectional view along the line 15-15 of FIG. 14.

Referring to FIGS. 13-15, silicon-containing material 75 is formed within the upwardly-opening container structures 32, 34, 36, 38, 40, 42, 44, 46, 48, 50, 52 and 54, as well is within the trench 56. In some aspects, the silicon-containing material can be consider to be formed within openings narrowed by the conductive material 60. The silicon-containing material 75 can be formed to any suitable thickness, and in some aspects will be formed to a thickness of about 130 Å.

The silicon-containing material can comprise, consist essentially of, or consist of silicon, and can be either doped or undoped. In particular aspects, the silicon-containing material can comprise, consist essentially of, or consist of either amorphous or polycrystalline silicon. In the shown aspect of the invention, the silicon-containing material 75 is patterned to overlay retaining structure 30. Accordingly, the silicon-containing material 75 extends over peripheral region 18 and over the rows 102 extending between pairs of capacitor container rows. The silicon-containing material protects interfaces of titanium-containing material 60 and retaining structure 30 of material 28, as will be discussed in more detail below.

The silicon-containing material 75 can be formed in the shown pattern with a photolithographically-patterned photoresist mask which is subsequently removed. Although silicon-containing material 75 is shown to be formed and patterned after removal of masking material 80 (FIGS. 7-9), it is to be understood that the invention can also include aspects in which material 75 is formed prior to masking material 80 and is patterned using masking material 80 as a mask.

Figure 18:
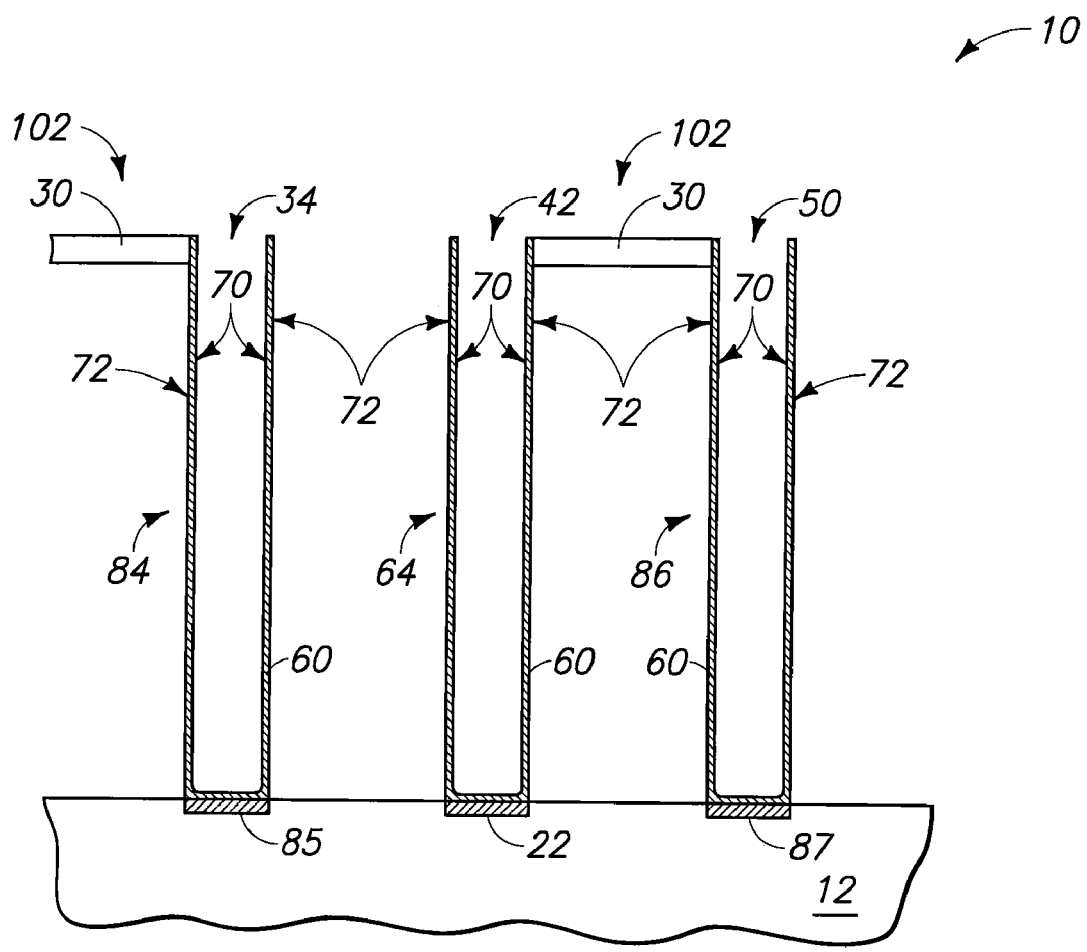
FIG. 18 is a diagrammatic, cross-sectional view along the line 18-18 of FIG. 17.

Referring next to FIGS. 16-18, construction 10 is exposed to conditions which isotropically remove material 28 selectively relative to retaining structure 30, and thereafter silicon-containing material 75 is removed. The etching can utilize, for example, a wet etch. For purposes of interpreting this disclosure and the claims that follow, an etch is considered to be selective for a first material relative to a second material if the etch removes the first material at a faster rate than the second material, including, but not limited to, conditions in which the second material is substantially not removed during the removal of the first material (i.e., conditions in which the rate of removal of the second material is essentially 0).

The removal of material 28 exposes outer surfaces 72 of the container structures (such as, for example, the container structures 62, 64, 66 and 68 of FIG. 14). In the shown aspect of the invention, material 28 is substantially entirely removed from over memory region 14, and accordingly an entirety of outer surfaces 72 are exposed. It is to be understood that the invention encompasses other aspects in which only a portion of material 28 is removed by the isotropic etch, and accordingly wherein only portions of the outer surfaces 72 are exposed.

As discussed previously, a material resistant to the etch of material 28 (i.e., an etch stop) can be provided under material 28 in aspects of the invention which are not shown. If the etch stop material is present, such can protect features underlying the etch stop during the isotropic etch of material 28.

Retaining material 30 remains in physical contact with portions of conductive material 60 of the containers formed from material 60, and accordingly supports the containers. Retaining structure can thus alleviate, and even prevent, toppling or other structural defects from occurring within an array of container structures. Structural material 30 can enable container structures having a high aspect ratio to be formed, and to have outer surfaces (72) exposed, while alleviating, and in particular aspects even preventing, toppling of the containers. In the aspect of the invention shown in FIG. 15, retaining material 30 connects alternating pairs of rows of a container structure array.

The silicon-containing material 75 (FIGS. 13-15) within the trench 56, the conductive material 60 within the trench, and the materials 30 and 75 over periphery 18 form a protective barrier (or shield) so that the isotropic etching of material 28 over memory region 14 does not extend into the material 28 associated with peripheral region 18. Such can alleviate damage to circuitry (not shown) associated with peripheral region 18 that could otherwise occur if an isotropic etch penetrated into the material 28 associated with peripheral region 18. The protective material 60 within trench 56 forms a protective trough (or moat) which protects material 28 of peripheral region 18 from the isotropic etch utilized in removing material 28 from over memory array region 14. In the shown aspect of the invention, the moat is double-sided.

Figure 19:
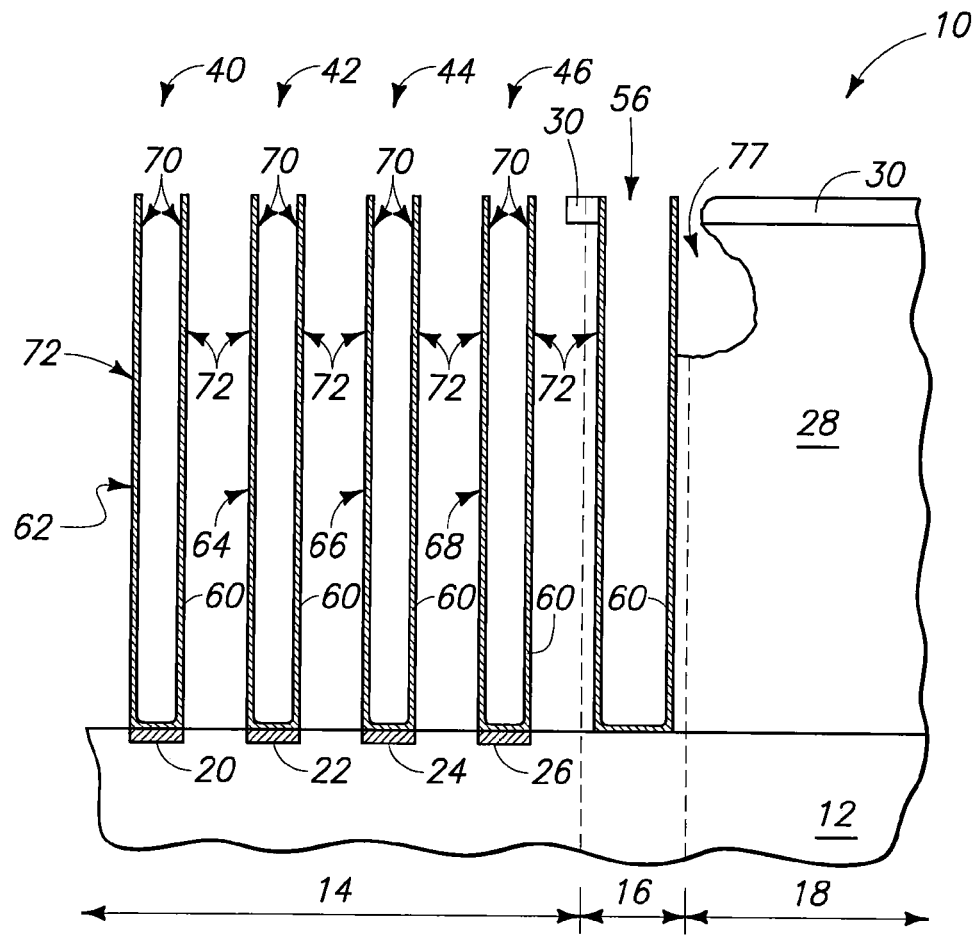
FIG. 19 is a view of the FIG. 1 cross-section shown at a processing stage subsequent to that of FIG. 10, illustrating an aspect alternative to that of FIG. 16 and showing a problem that can occur if the processing of FIGS. 13-15 is omitted.

The silicon-containing material 75 (FIGS. 13-15) can protect interfaces between retaining structure 30 and titanium-containing material 60. Specifically, there will commonly be a less-then-perfect seal between titanium-containing material 60 and retaining structure 30. Such less-then-perfect seal can be considered to constitute a defective region where the titanium-containing material 60 interfaces with retaining structure 30. Etchant utilized during the isotropic etch of material 28 can penetrate through such defective region to undesirably etch into the material 28 associated with peripheral region 18. For instance, FIG. 19 shows an exemplary structure resulting from an isotropic etch of material 28 without the protective silicon-containing material 75 being in place to protect an interface between the retaining structure 30 and the titanium-containing structure 60. Such has resulted in a cavity (or blowout region) 77 etching into the material 28 over peripheral region 18 during the isotropic etch of a material 28 over the memory array region 14. The shown cavity is relatively small, but it is to be understood that the cavity could be much larger so that devices associated with peripheral region 18 (such devices are not shown) become damaged.

Figure 20:
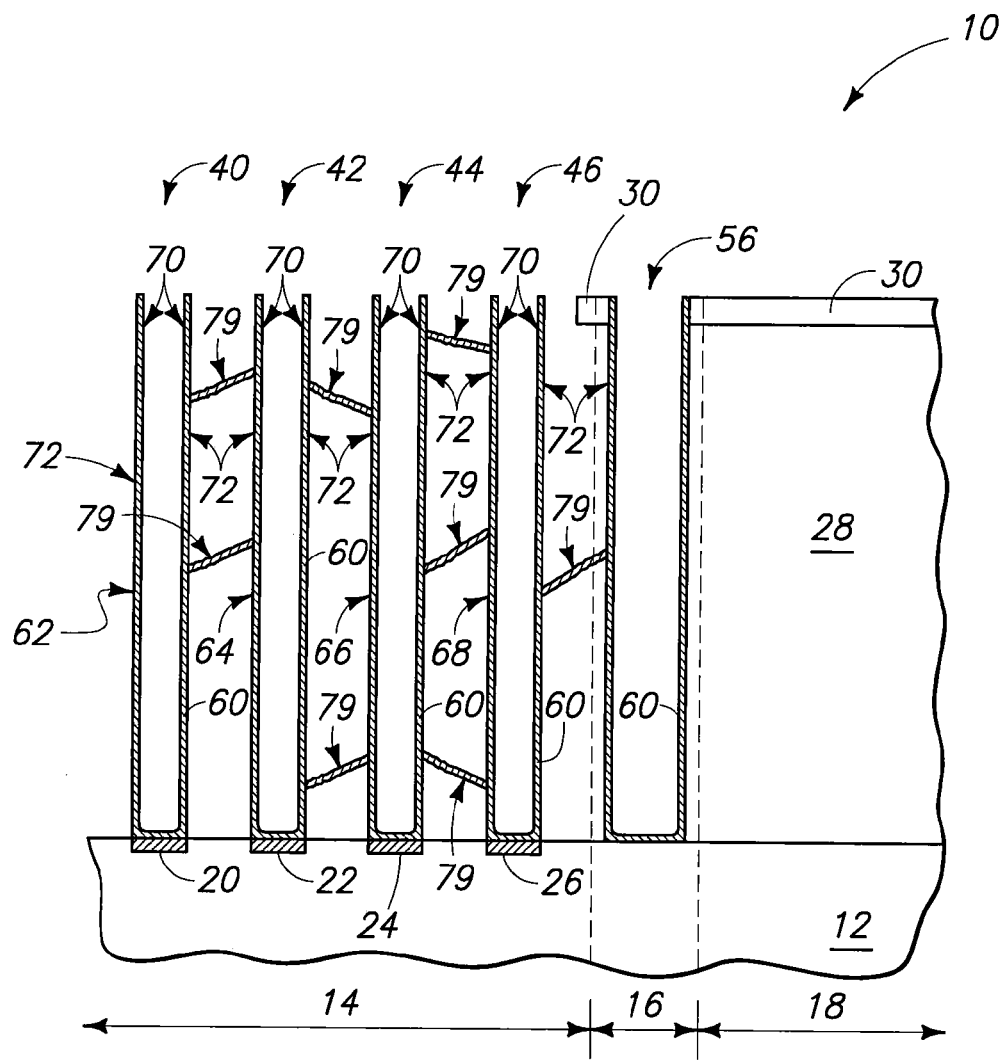
FIG. 20 is a view of the FIG. 1 cross-section shown at a processing stage subsequent to that of FIG. 16 illustrating a problem that can sometimes occur.

The silicon-containing material 75 of FIGS. 13-15 can thus serve an important purpose of protecting interfaces between retaining structure 30 (which can be a nitride-containing structure) and titanium-containing material 60. Unfortunately, utilization of silicon-containing material 75 can introduce significant complications into the processing. Specifically, the silicon etch utilized to remove silicon-containing material 75 can form whiskers (or bridges) of conductive material extending between adjacent containers. Such is illustrated in FIG. 20 where whiskers 79 of conductive material are shown to extend between adjacent containers and form conductive bridges extending between and connecting containers 40, 42, 44 and 46 with one another, as well as connecting container 46 with the conductive material 60 in moat 56. Is found that the conductive whiskers tend to comprise titanium from the titanium-containing material 60. Further, if titanium-containing show 60 comprises both titanium and titanium nitride, it appears that the whiskers will generally comprise primarily titanium, rather than also comprising titanium nitride.

The invention includes new etching procedures for removing silicon-containing material 75 which can alleviate, and in some aspects entirely eliminate, undesirable whisker formation; and also includes etches which can be utilized to remove whiskers to the extent that such whiskers form.

In one aspect of the invention, it is found that dispersion of at least one phosphorus-and-oxygen-containing compound in the etchant utilized to remove silicon-containing material 75 can be effective to significantly reduce titanium-containing whisker formation. The phosphorus-and-oxygen-containing compound with typically be initially provided in an etching solution as phosphoric acid, and thus the at least one phosphorus-and-oxygen-containing compound can initially comprise, consist essentially of, or consist of phosphoric acid.

Generally, the etching solution utilized to remove the silicon-containing material will comprise one or more nitrogen-containing etching compounds, such as, for example, ammonium hydroxide and tetra-methyl ammonium hydroxide. The total concentration of the one or more nitrogen-containing etching compounds can be from about 2 volume percent about to about 50 volume percent, and typically will be from about 5 volume percent to about 25 volume percent. The phosphoric acid can be initially provided to a concentration of from about 0.1 volume percent to about 1 volume percent, and typically will be provided to a concentration of from about 0.2 volume percent to about 0.4 volume percent. Thus, a volume ratio of a total amount of the at least one nitrogen-containing etching compound to the total amount of the at least one phosphorus-and-oxygen-containing compound can be from about 2:1 to about 500:1; and typically will be from a 20:1 to about 500:1. An exemplary silicon etch of the present invention can utilize about 0.3 volume percent phosphoric acid and about 10 volume percent ammonium hydroxide for the etching composition, thus will have a ratio of nitrogen-containing etching compound to phosphorus-and-oxygen-containing compound of about 300:1.

The amount of phosphoric acid provided within the etching solution is so small that the solution remains alkaline. Accordingly, even though the form of phosphorus-and-oxygen-containing compound initially provided within the etching solution may be phosphoric acid, it is generally a phosphate that is present in the etching solution under the conditions that the solution is used for etching the silicon-containing material 75.

A silicon etch of the present invention can be conducted at a temperature of from about 20° C. to about 100° C., with an exemplary temperature being from about 30° C. to about 60° C., and a typical temperature being about 55° C. It can be preferred that the etching composition be stirred or otherwise agitated during the etching of the silicon, as such can help to alleviate whisker formation.

It is found that the dispersion of the phosphorus-and-oxygen-containing compound will slow an etch rate of material 75 relative to the rate which would occur if the phosphorus-and-oxygen-containing compound were omitted. For instance an etch rate of silicon-containing material 75 with a dilute ammonium hydroxide solution (i.e., a solution containing about 3 volume percent $NH_4OH$) is about 550 Å/minute at a temperature of 55° C., and such rate drops to about 300 Å/minute with the addition of about 3000 parts per million phosphoric acid. The reduction of etch rate may seem disadvantageous, but the associated reduction of whisker formation can be a significant advantage that more than offsets the disadvantage of the reduced etch rate.

Phosphorus-and-oxygen-containing compounds, like phosphoric acid, can be much preferred over other potential additives for reducing whisker formation. The phosphorus-and-oxygen-containing compounds do not attack titanium nitride to the extent that other tested additives do. For instance, hydrogen peroxide, nitric acid, hydrochloric acid and sulfuric acid were tested as additives for preventing whisker formation, and all were found to attack titanium nitride so aggressively that it was difficult to establish conditions that would alleviate whisker formation while still maintaining integrity of the material 60 within the container structures.

If titanium-containing whiskers form, such can be removed with any etch suitable for removing titanium, and in some applications it can be preferred that such whiskers be removed with an etch which is selective for removal of titanium relative to titanium nitride. The reason that it can be preferred to use an etch selective for titanium relative to titanium nitride is that such can reduce loss of conductive material 60 from the capacitor storage nodes. Specifically, conductive material 60 typically comprises a layer of titanium nitride over a layer of titanium; and the whiskers formed during the etching of silicon-containing material 75 will typically primary comprise titanium rather than titanium nitride. Thus, an etch selective for titanium relative to titanium nitride can remove the whiskers selectively relative to at least a portion of the conductive material 60.

An etch utilized to remove the titanium-containing whiskers can, for example, comprise one or more of hydrofluoric acid, ammonium fluoride, nitric acid and hydrogen peroxide. If the etch utilizes hydrofluoric acid, such can be present in the etching composition to a concentration of from about 0.2 volume percent to about 1 volume percent; if the etch utilizes hydrogen peroxide, such can be present in the etching composition to a concentration of from about 0.5 volume percent to about 10 volume percent; and if the etch utilizes nitric acid, such can be present in the etching composition to a concentration of about 1 volume percent to about 10 volume percent. In some aspects, the etch can utilize water, ammonium hydroxide and hydrogen peroxide, in an etch and analogous to the so-called standard clean one (SC1). In such aspect, the ratio of water to ammonium hydroxide to hydrogen peroxide can be from about 10:1:1 to about 100:1:1. In some aspects, the etch can use a combination of ammonium fluoride, phosphoric acid (or phosphate) and water. Regardless of which etching chemistry is utilized, the etch can be conducted at a temperature of from about 20° C. to about 60° C.

The prevention and/or removal of the whiskers leads to a structure of the type described with reference to FIGS. 16-18.

Figure 23:
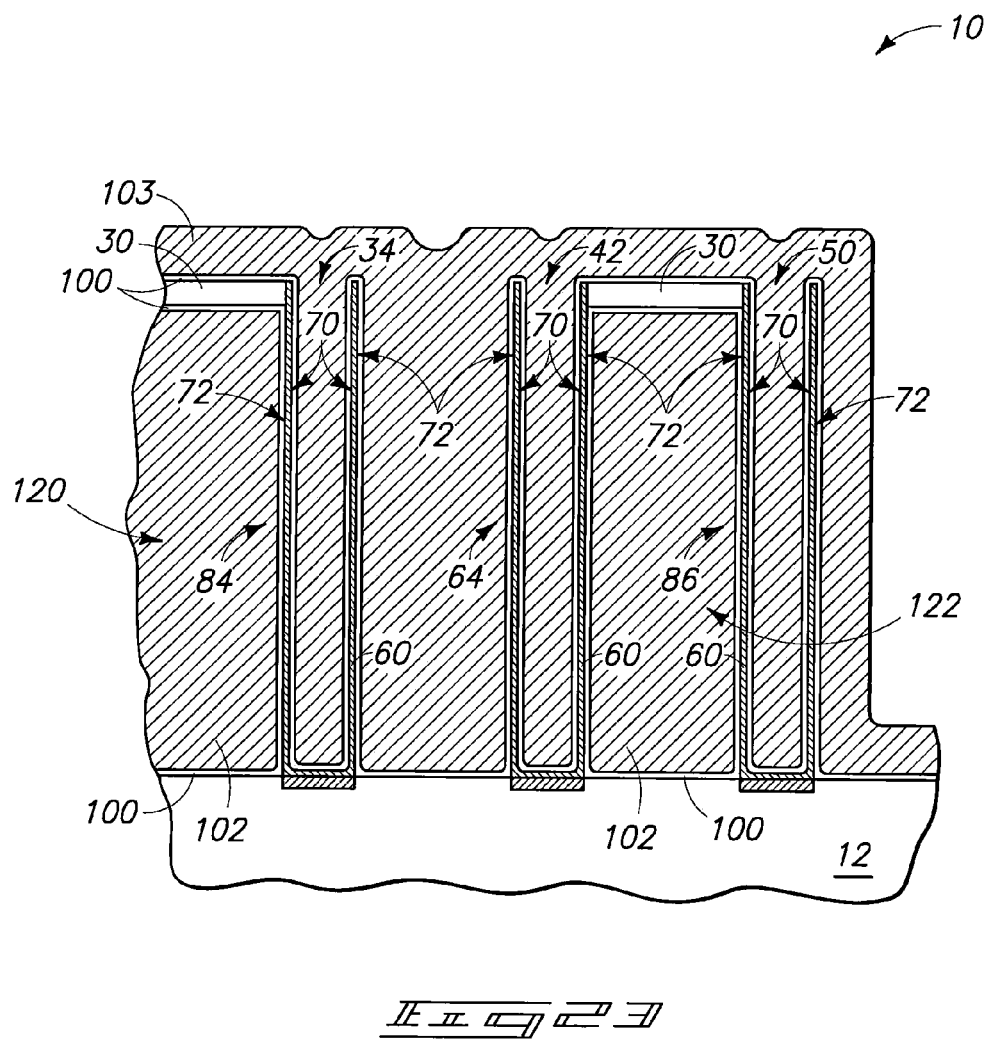
FIG. 23 is a diagrammatic, cross-sectional view along the line 23-23 of FIG. 21.

Referring next to FIGS. 21-23, a dielectric material 100 and a conductive material 103 are formed within openings 32, 34, 36, 38, 40, 42, 44, 46, 48, 50, 52 and 54, as well as along outer sidewall edges 72 of the container structures. Conductive material 60 of the capacitor container structures can be referred to as a first capacitor electrode, and conductive material 103 can be referred to as a second capacitor electrode. The capacitor electrodes 60 and 103, together with dielectric material 100, form an array of capacitors within the array of openings 32, 34, 36, 38, 40, 42, 44, 46, 48, 50, 52 and 54. The openings, together with trench 56, are shown in phantom view in FIG. 22 to indicate that such are below conductive material 103 in the shown view.

A gap 104 is illustrated beneath the portion of retaining structure 30 jutting outwardly from the protective material 60 within trench 56. It is to be understood that gap 104 can, in particular aspects, be filled through appropriate deposition of one or both of dielectric material 100 and conductive material 102.

Transistor structures 110, 112, 114 and 116 are diagrammatically illustrated in FIG. 21. The transistor structures would have source/drain regions either encompassing node locations 20, 22, 24 and 26, or ohmically connected with node locations 20, 22, 24 and 26. The transistor devices and capacitors formed in accordance with methodology of the present invention can be together incorporated into an array of DRAM cells.

FIG. 23 shows regions 120 and 122 beneath the retaining structure 30 filled with materials 100 and 102.

Figure 24:
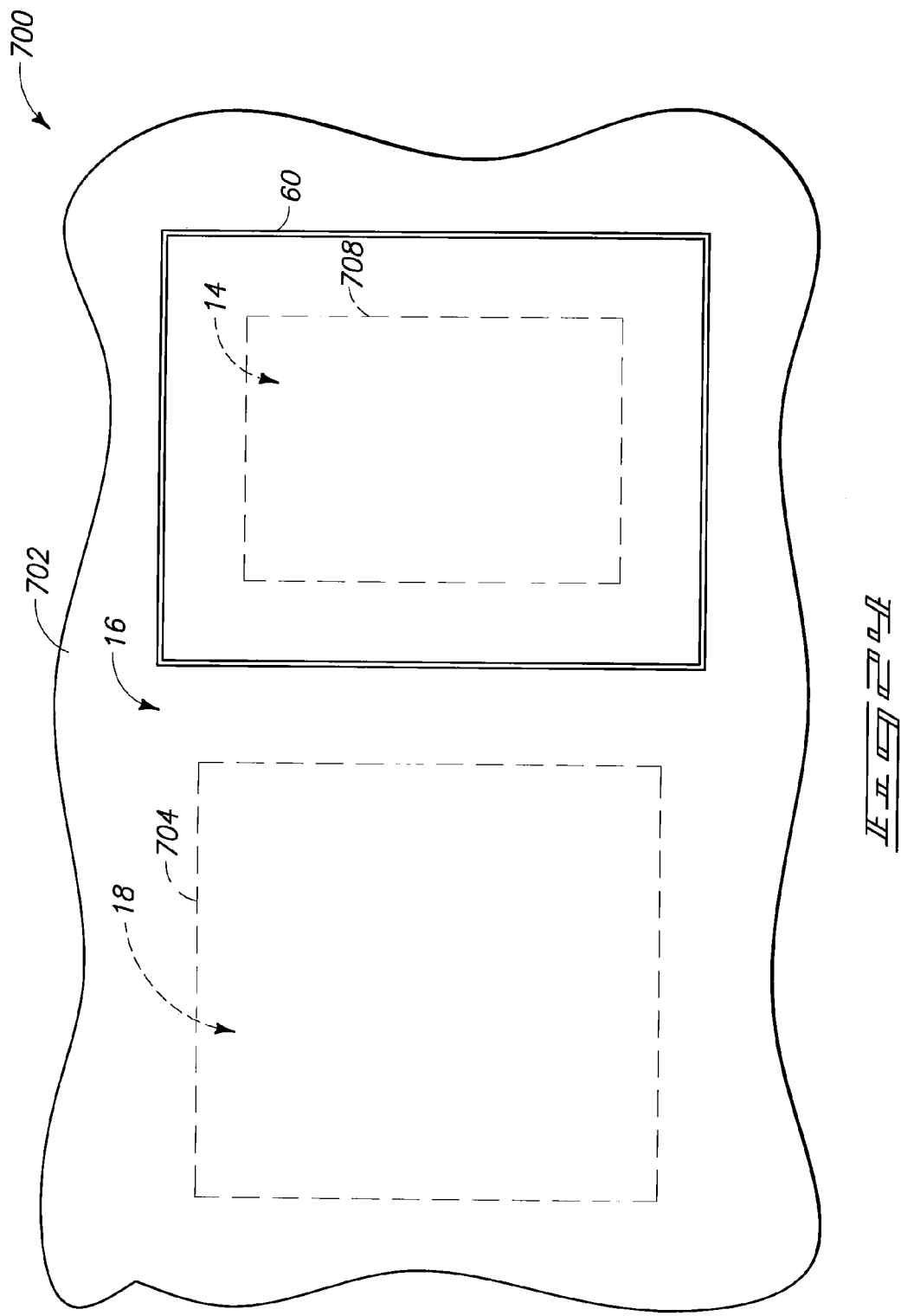
FIG. 24 is a diagrammatic top view of a fragment of a semiconductor construction illustrating an exemplary liner formed in accordance with an aspect of the present invention.
Figure 25:
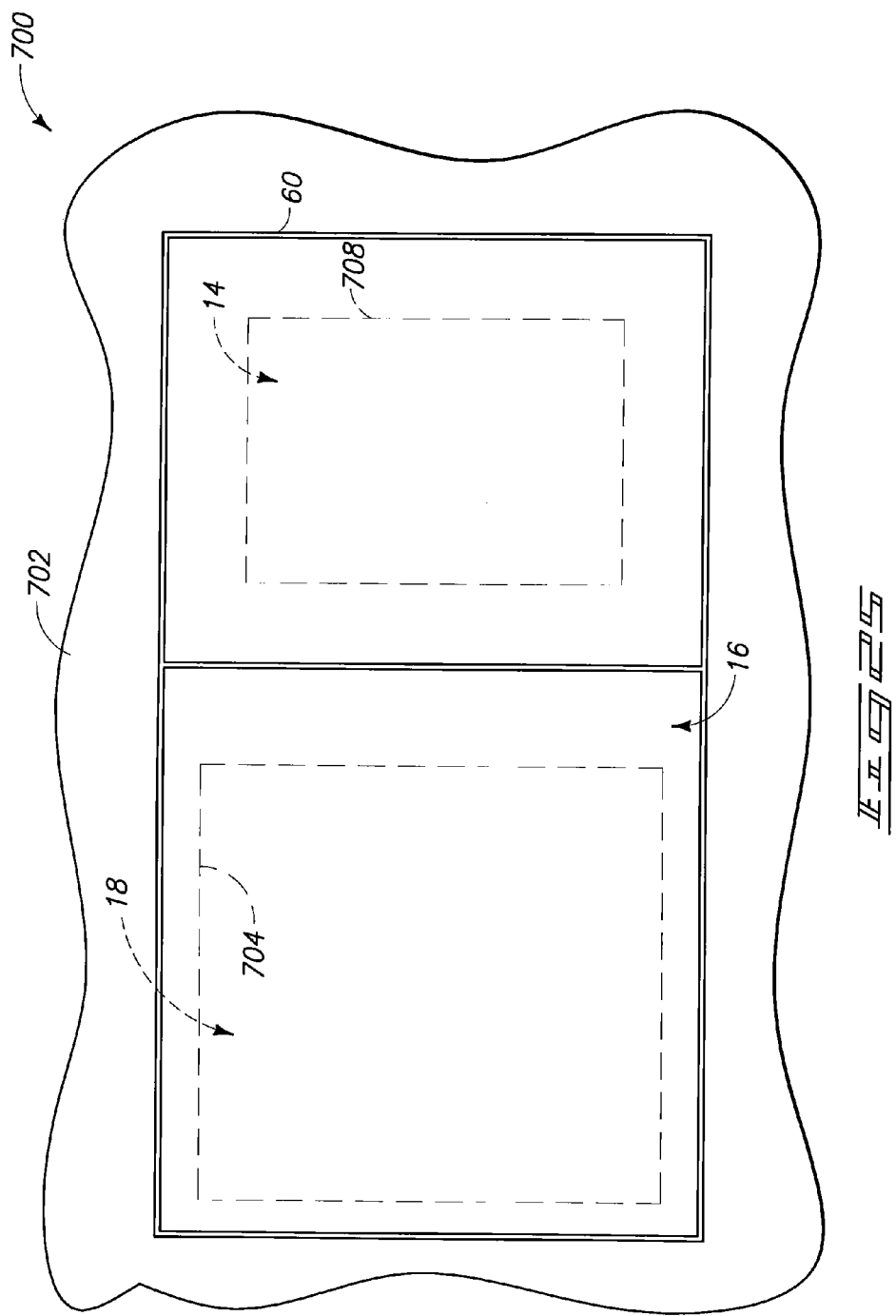
FIG. 25 is a diagrammatic top view of a fragment of a semiconductor construction illustrating another exemplary liner formed in accordance with an aspect of the present invention.

The trough in region 16 can be advantageously utilized to entirely surround a region of a semiconductor construction. In the aspects of the invention described above, the trough is created by forming an electrically conductive material in trough-shaped configuration between a memory array region and a peripheral region (see, for example, FIGS. 16 and 17 where the trough is shown formed from conductive material 60 over the region 16 between memory array region 14 and peripheral region 18). FIGS. 24 and 25 illustrate exemplary configurations in with the trough is formed to protect a lateral periphery of a peripheral region from the isotropic etch utilized to remove material 28 from region 14 (an exemplary isotropic etch is described above with reference to FIGS. 16-19).

FIG. 24 shows a top view of an exemplary construction 700 comprising a substrate having a memory array region 14 (diagrammatically illustrated as a box bounded by dashed line 708), a region 18 peripheral to the memory array where logic or other circuitry can be formed (diagrammatically illustrated as a box bounded by dashed line 704), and a region 16 between the memory array region 14 and the peripheral region 18. The memory array region has a lateral periphery defined to entirely laterally surround the memory array region, with such lateral periphery corresponding to dashed line 708, and the peripheral region has a similar lateral periphery defined by dashed line 704. The trough of conductive material 60 is shown laterally surrounding an entirety of the lateral periphery of memory array region 14.

FIG. 25 shows a top view of the construction 700 illustrating that the trough of conductive material 60 can extend entirely around the lateral periphery of the peripheral region as well as extending entirely around the lateral periphery of the memory array region.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
    forming upwardly-opening titanium-containing container structures within a first material and over a semiconductor substrate;
    forming silicon within the upwardly-opening titanium-containing container structures;
    after forming the silicon, removing at least some of the first material to expose outer surfaces of the upwardly-opening titanium-containing container structures;
    removing the silicon with an etching solution having at least one phosphorus-and-oxygen-containing compound therein, the etching solution utilized during the removal of the silicon causing formation of whiskers of titanium-containing material from the upwardly-opening titanium-container structures; and
    exposing the titanium-containing container structures and whiskers to an etch to remove the whiskers.

2. The method of claim 1 wherein the etching solution utilized to remove the silicon comprises one or more nitrogen-containing etching compounds.

3. The method of claim 2 wherein a total concentration of the at least one phosphorus-and-oxygen-containing in the etching solution is from about 0.1 volume percent to about 1 volume percent.

4. The method of claim 2 wherein a total concentration of the one or more nitrogen-containing etching compounds is from about 2 volume percent to about 50 volume percent.

5. The method of claim 2 wherein a total concentration of the one or more nitrogen-containing etching compounds is from about 5 volume percent to about 25 volume percent.

6. The method of claim 5 wherein the one more nitrogen-containing etching compounds are one or both of ammonium hydroxide and tetra-methyl ammonium hydroxide.

7. The method of claim 2 wherein a total concentration of the at least one phosphorus-and-oxygen-containing compound in the etching solution is from about 0.2 volume percent to about 0.4 volume percent.

8. The method of claim 7 wherein a total concentration of the one or more nitrogen-containing etching compounds is from about 2 volume percent to about 50 volume percent.

9. The method of claim 7 wherein a total concentration of the one or more nitrogen-containing etching compounds is from about 5 volume percent to about 25 volume percent.

10. The method of claim 9 wherein the one more nitrogen-containing etching compounds are one or both of ammonium hydroxide and tetra-methyl ammonium hydroxide.

11. The method of claim 1 wherein the first material comprises one or more of borophosphosilicate glass, spin-on-glass, silicon dioxide, phosphosilicate glass and borosilicate glass.

12. The method of claim 1 wherein the titanium-containing container structures include both elemental titanium and titanium nitride; and wherein the etch utilized to remove the whiskers is selective for elemental titanium relative to titanium nitride.

* * * * *